United States Patent [19]
Bradley, III et al.

[11] Patent Number: 5,623,127
[45] Date of Patent: Apr. 22, 1997

[54] SINGLE ALLOY SOLDER CLAD SUBSTRATE

[75] Inventors: Edwin L. Bradley, III, Sunrise; Kingshuk Banerji, Plantation; William B. Mullen, III, Boca Raton, all of Fla.

[73] Assignee: Motorola, Inc., Schaumburg, Ill.

[21] Appl. No.: 348,427

[22] Filed: Dec. 2, 1994

[51] Int. Cl.⁶ ........................................ H05K 1/02
[52] U.S. Cl. ............................... 174/259; 174/257
[58] Field of Search .................................. 174/259, 257, 174/256, 260, 261; 361/751

[56] References Cited

U.S. PATENT DOCUMENTS

| | | | |
|---|---|---|---|
| 3,621,442 | 11/1971 | Racht | 338/309 |
| 4,914,814 | 4/1990 | Behun et al. | 29/843 |
| 5,154,341 | 10/1992 | Melton et al. | 228/180.2 |
| 5,178,965 | 1/1993 | Tench et al. | 428/612 |
| 5,233,504 | 8/1993 | Melton et al. | 361/760 |
| 5,458,281 | 10/1995 | Downing et al. | 228/264 |

*Primary Examiner*—Laura Thomas
*Attorney, Agent, or Firm*—Dale W. Dorinski

[57] ABSTRACT

A solder clad printed circuit board (100) consists of an electrically insulating substrate that has copper circuit traces (105), portions of which are solderable. A substantially planar layer (120) of a soldering composition is fused to the solderable traces, to form a solder pad that is not domed. The layer is composed of a mass of off-eutectic solder particles (115) that are fused together to form an agglomeration (120) having a porous structure. The solder particles are fused together by heating the off-eutectic solder to a temperature that is between the solidus temperature and the liquidus temperature of the solder. The solder is then cooled below the solidus temperature to solidify it.

16 Claims, 2 Drawing Sheets

SINGLE ALLOY SOLDER CLAD SUBSTRATE

CROSS REFERENCE TO RELATED APPLICATIONS

This application is related to U.S. application Ser. No. 08/236,615, filed May 2, 1994, entitled "Solder Clad Substrate", by Kazem-Goudarzi et al., and assigned to Motorola, Inc.

TECHNICAL FIELD

This invention relates in general to a soldering, and more particularly to a circuit carrying substrate clad with a solder alloy.

BACKGROUND

Soft solder is a fusible alloy, typically consisting of tin and lead, which is used for the purpose of joining together two or more metals at temperatures below their melting points. In addition to tin and lead, solders may occasionally contain varying amounts of other materials, such as antimony, bismuth, cadmium, or silver, which are typically added for the purpose of varying the physical properties of the alloy. However, in many solders, some of these elements, notably antimony, are only present as impurities. Solder is widely used in the electronics industry for attaching electrical components to printed circuit boards. Printed circuit boards typically have an electrical conductor pattern consisting of a thin metal sheet, etched to form the pattern. In order to successfully attach the electrical components to the printed circuit board, there must be a metallurgical affinity between the two metals that are going to be soldered together, the metals must be free from all off-metallic surface contamination, there must be complete and adequate metallic contact between the solder and the metals that are to be soldered, and there must be a temperature adequate for sufficient alloying of the metal. The solder provides the attachment by virtue of an intermetallic solution, which takes place at the soldering temperature.

One method of assembling electronic assemblies is by a process known as solid solder deposition, where solder paste is printed and reflowed on the solderable surfaces of a printed circuit board (PCB) during the PCB fabrication. The advantage of this method is that the solder flux and the electronic components can then be placed directly on the PCB, without having to print solder paste. Two of the disadvantages of this method are: the paste that is clad onto the PCB results in a highly domed surface on the solder pads thereby degrading the accuracy of components placement; and the parts and flux tend to slide off of the domed surface when they are placed and while the circuit board is subjected to vibrations moving down the assembly line. Some have attempted to solve this problem by reducing the amount of solder paste dispensed onto the solder pad, thus decreasing the curvature of the domed surface. Others have attempted to flatten the domed solder surfaces by using a heated roller or platen. However, reducing the volume of solder paste decreases the total wetting forces of the solder on the pad and, therefore, reduces the tendency of the components to self center during the assembly reflow operation. This self-centering tendency is extremely important to assure accurate alignment and high-yield soldering. In addition, one would like to maximize the amount of solder deposited on the board during the cladding process in order to create a full solder fillet between the component and the PCB. Besides increasing soldering yields, solder joint reliability is negatively impacted when solder volumes are reduced.

Clearly, it would be a benefit to the electronics industry if a method of soldering could be devised that includes the advantages of both solid solder deposition and solder printing, but avoids the disadvantages of both processes.

SUMMARY OF THE INVENTION

Briefly, according to the invention, there is provided an electrically insulating substrate having solderable portions. A substantially planar layer of a soldering composition is fused to the solderable portions. The layer is composed of a mass of off-eutectic solder particles that are fused together to form an agglomeration having a porous structure. In one embodiment, the solderable portions are copper circuit traces, and the solder particles are fused together to form a substantially planar coating on the copper circuit traces by heating the off-eutectic solder to a temperature that is between the solidus temperature and the liquidus temperature of the solder. The solder is then cooled below the solidus temperature to solidify it.

DETAILED DESCRIPTION OF THE PREFERRED EMBODIMENT

Figure 1:
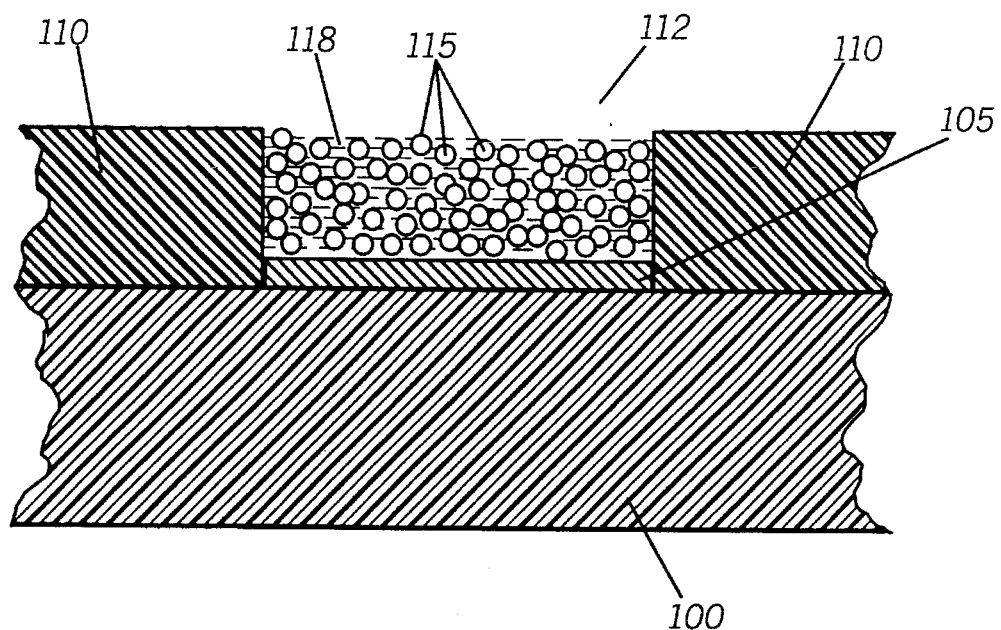
FIG. 1 is a schematic representation of an off-eutectic solder paste printed on a substrate, prior to heating, in accordance with the invention.

While the specification concludes with claims defining the features of the invention that are regarded as novel, it is believed that the invention will be better understood from a consideration of the following description in conjunction with the drawing figures, in which like reference numerals are carried forward.

Figure 3:
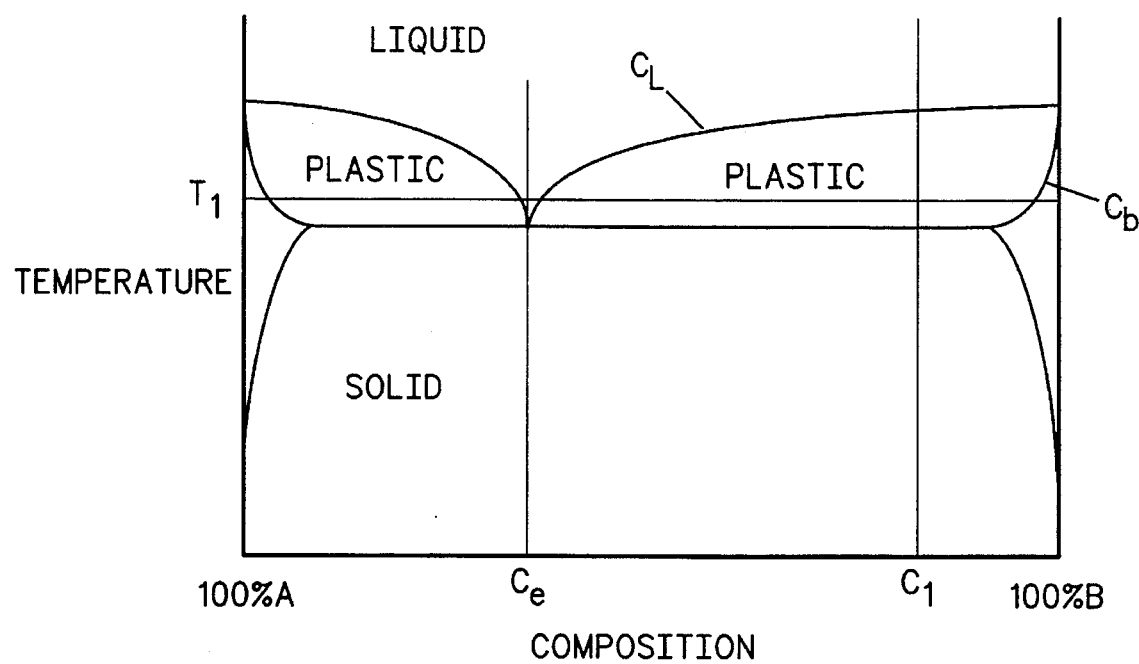
FIG. 3 is a phase diagram of a solder alloy.

Most solders are alloys of tin and lead. Pure lead melts at 327° C. and pure tin melts at 232° C. When these two metals are mixed, it results in a composition having a lower melting point than either of the individual components. A schematic of this relationship is known as a phase diagram and one similar to the tin-lead diagram is shown in FIG. 3. Depending upon the percentage composition of the tin and lead, the melting point will vary. However, there is one alloy having a composition of 63% tin and 37% lead, known as the eutectic composition, that has the lowest melting point (183° C.) of any of the possible mixtures (composition $C_e$). This eutectic composition also has the characteristic of having a sharp and distinct melting point precisely at this temperature. That is, the solder alloy undergoes a complete phase change from solid to liquid at this point. All other compositions of tin and lead, other than the eutectic, are mixtures which do not melt sharply at any one temperature, but which pass through an intermediate range of plasticity in cooling from the liquid to the solid state. In fact, it is traditional for metallurgical purposes to consider tin-lead solder not as an alloy of tin and lead, but rather as a eutectic alloy plus lead, or a eutectic alloy plus tin, as the case may be.

These various alloys that pass through an intermediate range of plasticity are said to have a melting range and are referred to as off-eutectic alloys. Above the melting range, the alloy is a liquid. Below the melting range, the alloy is a solid. However, within the melting range, it is a plastic-like material that cannot be defined strictly as a liquid nor as a solid. The lower temperature of the melting range is known as the solidus temperature, and the upper temperature of the melting range is known as the liquidus temperature. At temperatures below the solidus temperature, the alloy is a solid, and at temperatures above the liquidus temperature, the alloy is a liquid. Materials other than tin and lead may be added to the alloy and will cause similar types of behavior. Examples of some materials are aluminum, antimony, arsenic, bismuth, cadmium, copper, indium, iron, nickel, silver, and zinc. Because many solder alloys exhibit a melting range rather than a pure melting point, a great deal of confusion exists over exactly what point may be considered to be the melting point of solder. For purposes of this invention, the melting point of a solder is considered to be that point at which the alloy transitions from a solid either to a liquid or to a plastic type composition; that is the melting point may be considered to be equivalent to the lower end of the melting range, or the solidus point.

This invention provides a flat solder surface on the solderable portions of a printed circuit board, and can be used in both single-sided and double-sided printed circuit assemblies. It improves the fluxing and part placement accuracy of automated placement systems. Typically, the manufacturer of the printed circuit board adds the solder to the printed and etched board during the fabrication process. In the preferred embodiment of the invention, an off-eutectic alloy solder paste is applied to the solderable surfaces of the printed circuit board. The off-eutectic solder paste or soldering composition is made from a tin-lead alloy which is about 90% tin and 10% lead, by weight, and which has a solidus temperature of about 183° C. and a liquidus temperature of about 213° C. The solder alloy is in the form of finely divided particles (such as spheres or irregularly shaped particles, having a mesh size of, for example, 300–500 mesh) and is suspended in a matrix of a vehicle and a fluxing agent, to form a solder paste. Techniques of forming solder pastes are well known to those skilled in the art, and many formulations for solder pastes may be found in the literature. Vehicles such as alcohols, glycols, and glycol ethers are commonly used, as are fluxing agents such as adipic, formic, citric and glutaric acids, among others. In other embodiments, alloys of elements such as tin, lead, bismuth, indium, copper, antimony, cadmium, arsenic, aluminum, gallium, gold, silver may also be used. Another example of a suitable alloy is an alloy of 43% tin, 43% lead and 14% bismuth. In this case, the solidus temperature is about 144° C. and the liquidus is about 163° C. It should be obvious that one skilled in the art may employ any one of a large number of off-eutectic alloys in the invention, and the invention is not intended to be limited by the examples provided. Using phase diagrams, metallurgists and others skilled in the art will be able to select the alloy and temperatures of choice.

Referring now to FIG. 1, a printed circuit board (PCB) 100 has a solderable surface 105. A mask 110 having appropriately placed openings 112 is placed on the PCB 100 so that the solderable surfaces 105 are exposed. The mask 110 can be temporary, as in the case of stencils or screen meshes, or it can be permanent, as in the case of a polymeric photoresist or soldermask. The off-eutectic alloy solder paste, containing solder particles 115, is deposited in the openings 112. In the preferred embodiment where the soldering composition is an off-eutectic alloy solder paste, the method of depositing the paste in the openings is accomplished by printing the paste, as is well known in the art. In other cases, the solder particles 115 and 120 may be deposited in other ways, for example curtain coating into photo-defined resist apertures, spraying, syringe dispensing, pin transfer, etc. The solder paste may have additional components 118 such as fluxes or vehicles that aid in the application and reflow processes.

Figure 2:
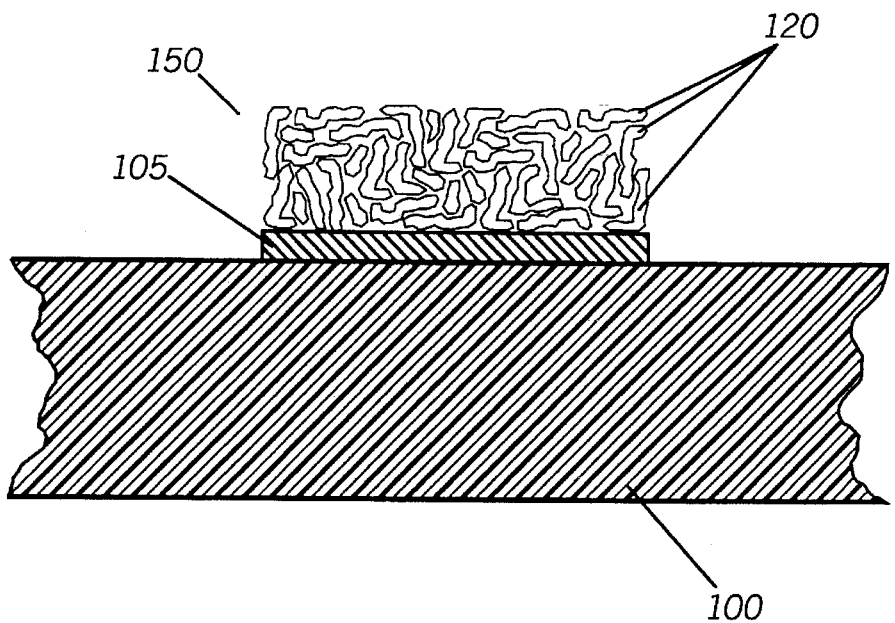
FIG. 2 is a schematic representation of an off-eutectic solder paste printed on a substrate, after heating above the solidus temperature, in accordance with the invention.

Referring now to FIG. 2, the off-eutectic alloy solder paste is heated to a temperature such that the particles are partially melted or liquefied, and exists in a semi-solid condition. In the preferred embodiment with the 90% tin and 10% lead alloy, the peak reflow temperature would be 188°–195° C. At this temperature, the alloy is partially liquefied, but still approximately keeps the original shape of the screen printed paste. The amount of liquid at any given temperature in the plastic zone of an off-eutectic alloy can be determined from a phase diagram such as that shown in FIG. 3 by using the formula:

$$\text{Percent Liquid at } T_1 = (C_b - C_1)/(C_b - C_L) * 100\%$$

(Note that $C_b$ and $C_L$ vary with temperature.) Thus, the desired off-eutectic composition, $C_1$, should be chosen such that the Percent Liquid at the cladding reflow temperature $T_1$ is no greater than 50%, with one preferred amount being about 30% when using the 90-10 tin/lead alloy. The solder spheres tend to agglomerate in this partially melted state, but since the alloy has not completely melted, the lack of surface tension allows the agglomerated solder mass to retain its flat shape. Upon cooling below its melt temperature, the solder alloy completely solidifies. It is this process of taking the solder alloy above the solidus temperature, but holding it in the plastic range by not exceeding the liquidus temperature, which creates a flat, uniform, solid solder surface. Additional operations may be performed on the reflowed circuit board to remove foreign materials, such as solvent cleaning to remove residual flux residue and excess solder balls. This is typically performed by cleaning with aqueous or organic cleaning agents. At this point, the PCB 100 is clad with a thick, but uniform and flat layer of solder 150 on the solderable surfaces 105. This flat layer of solder 150 consists of an aggregate-like structure 120 of the solder alloy particles that partially melted and attached together in a porous structure. The solder alloy particles have alloyed or formed a metallurgical bond to each other and to the metal circuit traces, thereby adding to the mechanical integrity of the resulting solder mass. The formation of the metallurgical bond occurs by the commingling of the liquid phase in the semi-solid particles during reflow.

The printed circuit boards may now be used in a solid solder deposition assembly process similar to that used with conventional clad printed circuit boards; that is, the surface is fluxed, and surface-mount components or parts are placed at the desired locations with the solderable portions of the parts in contact with the reflowed soldering composition on the printed circuit board. The flat surface of the solder pads aids in placing the parts, because the parts do not move about, compared to the domed pads found in the conventional art. In addition, the rough surface of the solder 150 aids in component retention and preventing the flux from spreading off of the solder pad. During the final reflow assembly, the temperature is high enough to completely melt the agglomerated solder particles 120. As the temperature passes above the solidus temperature (in the preferred embodiment 183° C.), the solder alloy begins to melt, and as the temperature exceeds the liquidus temperature (in the preferred embodiment 213° C.), the alloy becomes completely molten in a conventional manner. At this time the liquid solder forms a metallurgical bond with the component terminations.

Clearly, it can be seen that this invention provides the advantage of the creation of flat, uniformly rough surfaces on the solderable portions of a printed circuit board due to the presence of unmelted particles of solder in the partially-fused low-melting alloy. This creates a surface that is highly suitable for retention of any flux or tacking agent dispensed on the pad, whereas the domed surfaces found in conventional solder clad or reflowed PCBs are prone to flux loss by rolling or flowing off of the domed surfaces. Further, the flat surfaces provided by the invention provide more margin in the required component placement accuracy and improved retention of the surface mount placed components, as the components do not slide off of the flat solder pads. Surface tension provided during the reflow operation also aids in self-centering the part on the pad. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A circuit carrying substrate, comprising:

an electrically insulating substrate having solderable portions; and a substantially planar layer of a soldering composition fused to the solderable portions, the soldering composition comprising a mass of off-eutectic solder particles that are fused together to form an agglomeration having a porous structure.

2. The circuit carrying substrate of claim 1, wherein the off-eutectic solder particles have a size of about 300–500 mesh.

3. The circuit carrying substrate of claim 1, wherein the soldering composition comprises an alloy of 90% tin and 10% lead.

4. A circuit carrying substrate, comprising:

an electrically insulating substrate having solderable portions; and a substantially planar layer of a soldering composition fused to the solderable portions, the soldering composition comprising a mass of off-eutectic solder particles having a solidus temperature and a liquidus temperature, the off-eutectic solder particles fused together by heating at a temperature above the solidus temperature and below the liquidus temperature, to form an agglomeration having a porous structure.

5. The circuit carrying substrate of claim 4, wherein the off-eutectic solder particles comprise particles having a size of about 300–500 mesh prior to being fused together.

6. The circuit carrying substrate of claim 4, wherein the soldering composition comprises an alloy of 90% tin and 10% lead.

7. The circuit carrying substrate of claim 6, wherein the alloy is heated to between 188 and 195 degrees C.

8. A solder-clad printed circuit board, comprising:

a printed circuit board having copper circuit traces, portions of the copper circuit traces coated with a porous layer formed of off-eutectic solder particles that are fused together to form a substantially planar coating.

9. The solder-clad printed circuit board of claim 8, wherein the off-eutectic solder particles comprise particles having a size of about 300–500 mesh prior to being fused together.

10. The solder-clad printed circuit board of claim 8, wherein the off-eutectic solder particles are 90% tin and 10% lead.

11. The solder-clad printed circuit board of claim 10, wherein the off-eutectic solder particles are heated to between 188 and 195 degrees C.

12. A solder-clad printed circuit board, comprising:

a printed circuit board having copper circuit traces, the copper circuit traces coated with a layer having a porous structure and formed of particles of off-eutectic solder having a solidus temperature and a liquidus temperature, the particles fused together to form a substantially planar coating on the copper circuit traces by heating the off-eutectic solder to a temperature that is between the solidus temperature and the liquidus temperature of the solder and then cooling the solder below the solidus temperature to solidify it.

13. The solder-clad printed circuit board of claim 12, wherein the particles of off-eutectic solder comprise particles having a size of about 300–500 mesh.

14. The solder-clad printed circuit board of claim 12, wherein the off-eutectic solder is 90% tin and 10% lead.

15. The solder-clad printed circuit board of claim 14, wherein the off-eutectic solder is heated to between 188 and 195 degrees C.

16. A method of fabricating a printed circuit board having a flat, solder clad surface, comprising the steps of:

providing a printed circuit board having solder paste on exposed solderable portions, the solder paste comprising discrete particles of an off-eutectic solder alloy having a solidus temperature and a liquidus temperature;

heating the solder paste to a temperature that is above the solidus temperature but below the liquidus temperature, thereby fusing the discrete particles together to form an agglomeration having a porous structure;

cooling the solder paste below the solidus temperature to solidify the off-eutectic alloy.

* * * * *